United States Patent [19]

Batra

[11] Patent Number: 4,517,729
[45] Date of Patent: May 21, 1985

[54] METHOD FOR FABRICATING MOS DEVICE WITH SELF-ALIGNED CONTACTS

[75] Inventor: Tarsaim L. Batra, Cupertino, Calif.

[73] Assignee: American Microsystems, Incorporated, Santa Clara, Calif.

[21] Appl. No.: 421,543

[22] Filed: Sep. 22, 1982

Related U.S. Application Data

[63] Continuation-in-part of Ser. No. 287,388, Jul. 27, 1981, Pat. No. 4,466,172, which is a continuation-in-part of Ser. No. 1,840, Jan. 8, 1979, abandoned.

[51] Int. Cl.³ .................. H01L 21/283; H01L 21/318; H01L 29/78; H01L 21/225
[52] U.S. Cl. ........................ 29/571; 29/589; 29/590; 148/1.5; 148/187; 156/653; 357/23.9; 357/41; 357/91
[58] Field of Search ................... 29/571, 589, 590; 148/1.5, 187; 156/653; 357/23, 41, 59

[56] References Cited

U.S. PATENT DOCUMENTS

| | | | |
|---|---|---|---|
| 3,978,577 | 9/1976 | Bhattacharyya et al. | 29/571 |
| 4,079,504 | 3/1978 | Kosa | 29/571 |
| 4,103,415 | 8/1978 | Hayes | 29/571 |
| 4,192,059 | 3/1980 | Khan et al. | 29/571 |
| 4,221,044 | 9/1980 | Godejahn, Jr. et al. | 29/571 |
| 4,221,045 | 9/1980 | Godejahn, Jr. | 29/571 |
| 4,371,403 | 2/1983 | Ikubo | 148/1.5 |
| 4,455,737 | 6/1984 | Godejahn, Jr. | 29/571 |

*Primary Examiner*—Upendra Roy

*Attorney, Agent, or Firm*—Steven F. Caserza; Alan H. MacPherson; Richard Franklin

[57] ABSTRACT

A method for fabricating an integrated circuit semiconductor device comprised of an array of MOSFET elements having self-aligned or self-registered connections with conductive interconnect lines. The method involves the formation on a substrate of a thick oxide insulation layer surrounding active area openings. A gate electrode within each opening is utilized to provide self-registered source and drain regions. In two embodiments, the gate is covered on all sides and on its top surface with a protective layer of nitride or thick oxide. In one of the embodiments, after the formation of the source-drain regions a relatively thin protective layer of etch stopper is applied to the entire chip prior to the application of an upper insulative layer. When oversized windows are etched in the upper insulative layer, the etch stopper layer prevents etching of the nitride layer, thus preventing shorts or leaks between conductive and active areas and providing self-aligned contacts with minimum spacing from adjacent conductive areas. In another of the embodiments, a thick layer of oxide provides insulation between the gate, source-drain region and conductive lines. Two other embodiments teach novel methods of forming thick oxide protective layers for the gate sidewalls. With these methods, additional internal protection over prior art devices is provided in MOS devices with source-drain regions formed either by diffusion or ion implantation.

17 Claims, 68 Drawing Figures

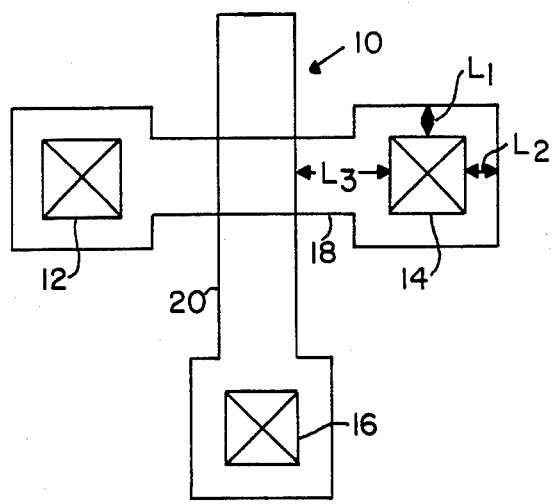
FIG. 1
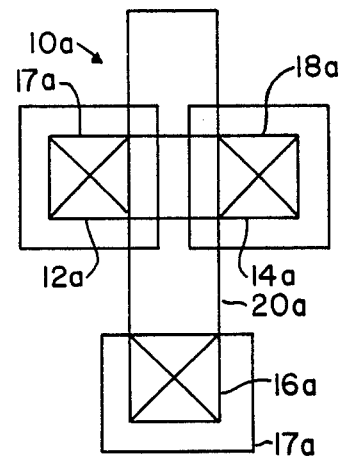
FIG. 2
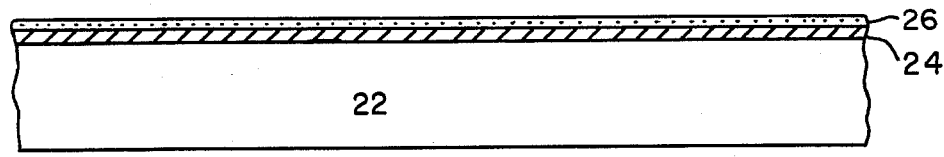
FIG. 3 a,b,c,d,e
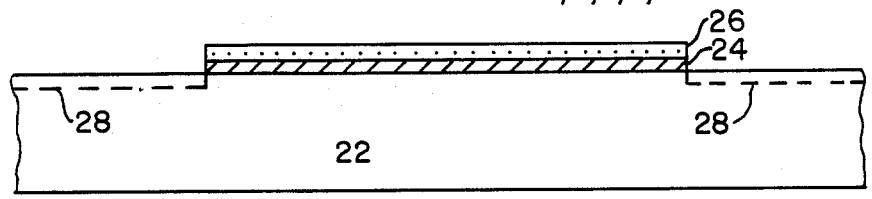
FIG. 4 a,b,c,d,e
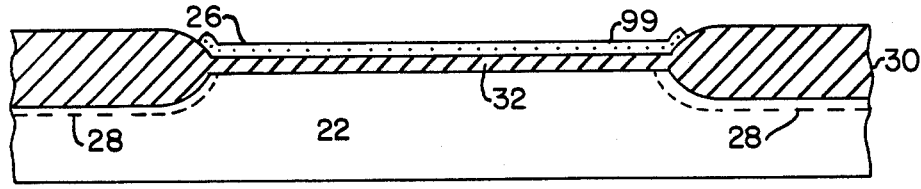
FIG. 5 a,b,c,d,e
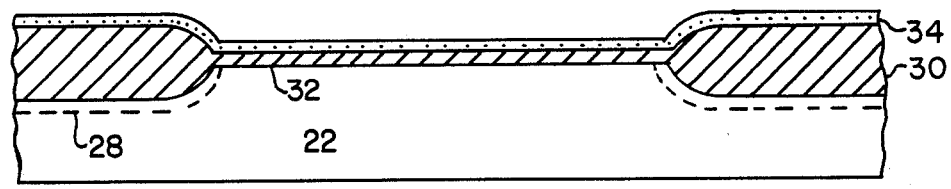
FIG. 6 a,b,c

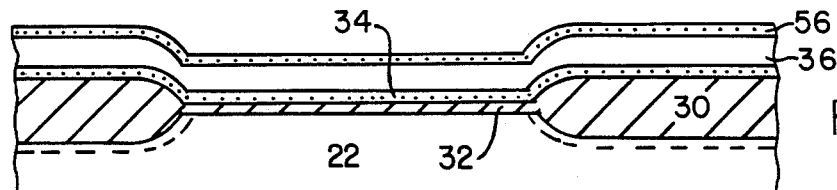
FIG. 7b,c
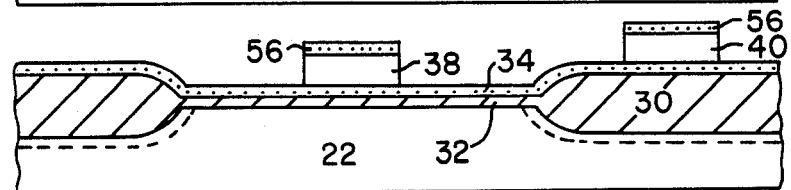
FIG. 8b
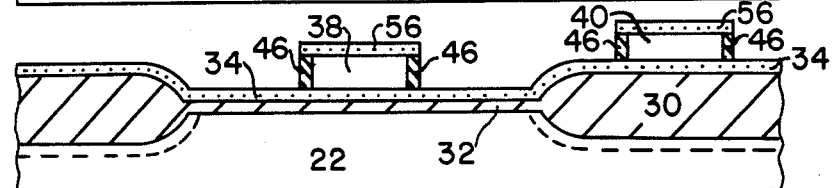
FIG. 9b
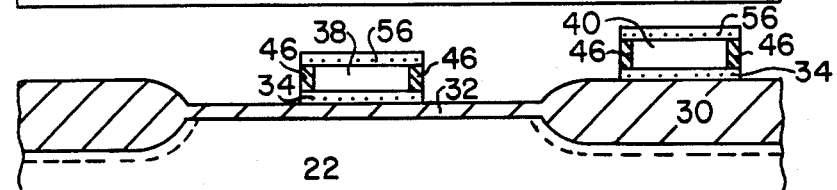
FIG. 10b
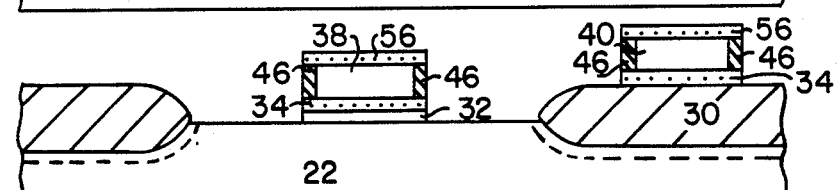
FIG. 11b
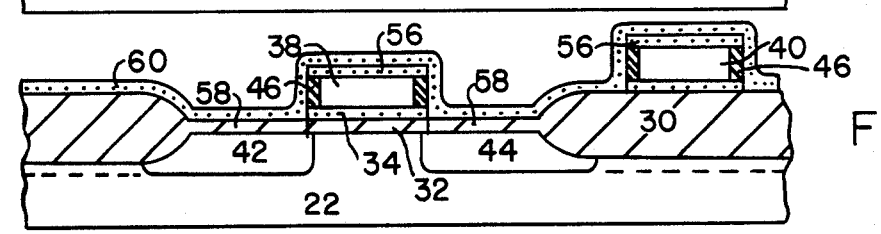
FIG. 12b
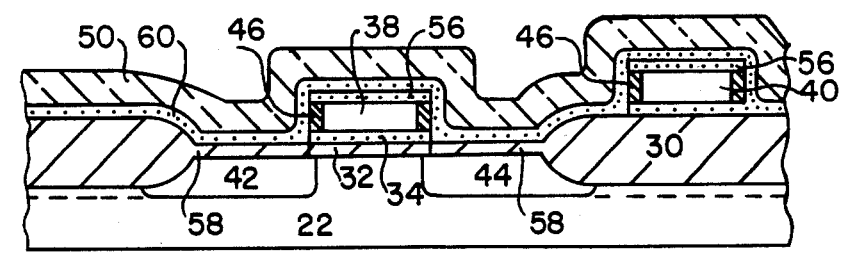
FIG. 13b

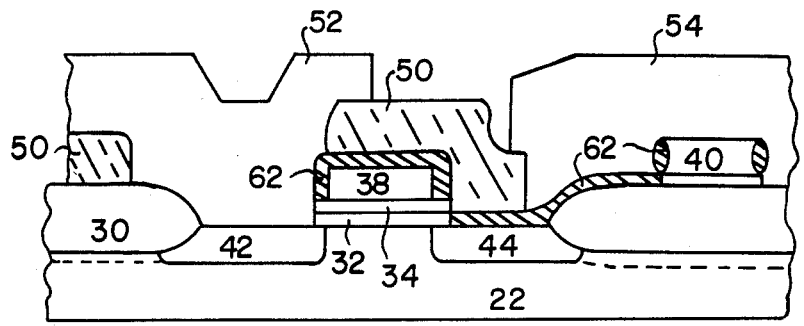
FIG. 14c
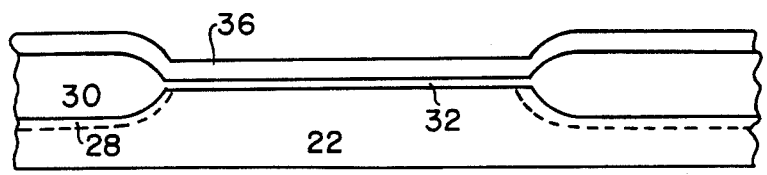
FIG. 6d,e
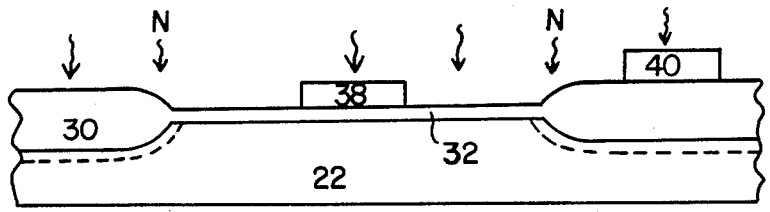
FIG. 7d
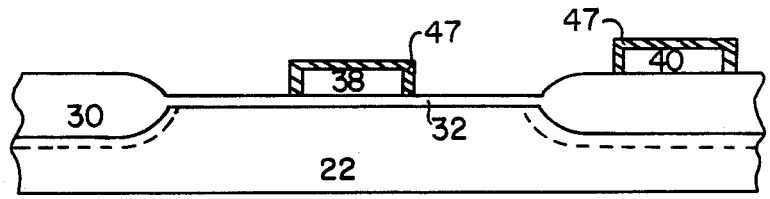
FIG. 8d
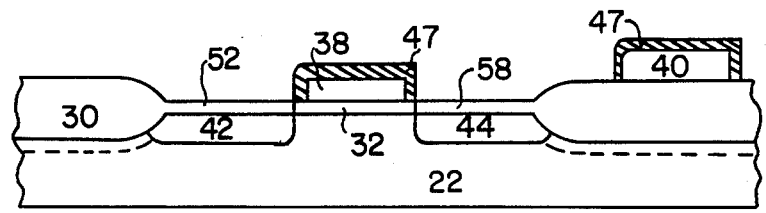
FIG. 9d

METHOD FOR FABRICATING MOS DEVICE WITH SELF-ALIGNED CONTACTS

This is a continuation-in-part of U.S. patent application Ser. No. 287,388 filed July 27, 1981 now U.S. Pat. No. 4,466,172, which in turn is a continuation-in-part of U.S. patent application Ser. No. 001,840 filed Jan. 8, 1979 now abandoned, both assigned to American Microsystems, Inc., the assignee of this application and both of which are hereby incorporated by reference.

BACKGROUND OF THE INVENTION

1. Field of the Invention

The present invention relates to semiconductors and more particularly to a method for fabricating integrated circuits with self-aligned contacts.

2. Description of the Prior Art

Large-scale MOS integrated circuits, often having thousands of MOSFETs on a single semiconductor chip, must have a plurality of electrically conductive contacts, through insulation overlying the surface of the semiconductor material, to the active and passive regions in this material to provide the necessary interconnection between circuit lines, source-drain regions and gate electrodes of individual transistor elements. Using prior art techniques, it is necessary to make oversized conductive areas in the semiconductor material and rather large contact openings through the insulation overlying these conductive areas in order to accommodate mask alignment tolerances. This results in low density devices requiring a relatively large chip area.

With the rapid increase in the number of MOSFET elements in large-scale integrated circuit devices, efforts have been made to reduce not only the size of each element but also the size of the required contacts.

One method of increasing the density of semiconductor devices and reducing the problem of mask alignment is to form "self aligned" contact openings utilizing oversized contact masks. In general, self-aligned contacts are formed by utilizing an oversized contact mask, thus eliminating the difficulties of mask alignment. The contact is formed within the contact opening of the contact mask such that the contact is completely contained within the region to be contacted, thus eliminating short circuits to adjacent areas. In other words, the contact is self aligned because even though the oversized contact mask may expose regions surrounding the region to be contacted, the contact formed is completely within the region to be contacted. In the prior art, the perimeter of the contact opening is bounded on at least one side (and often three sides) by field oxide, even though the oversized contact mask exposes a portion of the field oxide adjacent to the contact. Such a device is described, for example, in U.S. Pat. No. 3,648,125 at column 9, lines 59–66, and also in U.S. Pat. No. 3,913,211 and 3,936,858. However, in such prior art devices, the self alignment feature is only available with regard to contact edges bounded by field oxide. Contact edges adjacent to gate regions or interconnects may not be formed in a self aligned fashion in accordance with these prior art methods.

A second attempt to solve part of this problem described in J. Electrochem. Soc. Solid State Science and Technology, Vol. 125, No. 3, March 1978, pp. 471–472, is to provide a gate material of polycrystalline silicon which is coated on its sides and top with a thin silicon dioxide ($SiO_2$) layer which serves as an electrical insulation between the polycrystalline silicon gate and metallization interconnects formed above the gate regions. However, this proved to be unsatisfactory because it failed to eliminate short circuits due to breakdowns or fractures of the $SiO_2$ layer created during subsequent processing. The use of a thin oxide layer on the top and sides of the gate electrode is also disclosed in U.S. Pat. Nos. 4,103,415 and 4,169,270.

SUMMARY

The present invention overcomes the problems mentioned above as well as other problems and provides several other advantages in addition to providing a means for making a high density large-scale integrated circuit device with a substantially smaller area per MOS transistor element than was heretofore possible. Moreover, the invention makes possible the production of such high density devices wherein the source-drain regions of the MOSFET elements can be formed either by diffusion or ion implantation techniques.

In accordance with the principles of the present invention MOSFET elements with self-aligned contacts forming an integrated circuit device are fabricated in a semiconductor substrate by a method wherein an internal protective layer is formed covering the gate material. This protective layer protects the gate during subsequent process steps, thus assuring the integrity of the gate insulation layer and thereby preventing shorts between the gate and conductive interconnects.

Unlike prior art devices utilizing self-aligned contacts, the source and drain contacts formed in accordance with this invention are self aligned on all sides even though the oversized contact mask may expose field oxide, gate electrodes, and interconnects. By self-aligning the source and drain contacts on all four sides, the sources and drains can be made smaller and placed directly adjacent to the gate electrodes, thereby materially reducing the size of each transistor and materially increasing the packing density of the resulting integrated circuit.

Preliminary steps of the method utilize conventional fabrication techniques. After the field oxide areas are formed with active area openings for transistor elements, polysilicon gate areas are formed within the openings. Polycrystalline silicon (often called "polysilicon" or "poly") conductive interconnect lines are also simultaneously and selectively formed on the field oxide close or adjacent to such active area openings.

In one form of this invention, (FIGS. 3c to 14c) the polysilicon gates and conductive interconnecting lines are provided with a thin protective silicon nitride ("nitride") layer on their top surfaces. The nitride is removed from the gate and one intended source-drain region. The source-drain region is then formed by ion diffusion techniques with the polysilicon gate serving as a mask in as well-known manner. Thereafter, a thick protective oxide layer is formed over the exposed silicon surface of the gate and source-drain region. The thick protective oxide layer prevents internal shorts during the formation of oversized holes in the insulating PVX layer.

In another embodiment of the present invention (FIGS. 3d to 13d), the polysilicon gates and conductive lines are protected with a layer of silicon nitride formed on their top and side surfaces. Source-drain regions then are formed by diffusion techniques and thereafter a thin protective layer of oxide etch stopper is provided over the entire chip. A standard layer of phosphorus impregnated glass (PVX) is next applied to the entire chip and a contact mask on the PVX layer is used to form the necessary source-drain contact openings by etching away the PVX and the oxide etch stopper, but not the protective nitride layer. The poly gate areas are prevented from being attacked during this long PVX etch by the thin nitride protective layer.

In another embodiment of this invention (FIGS. 3e–14e), novel techniques are taught for forming thick oxide walls which protect poly gate and poly interconnect line. These thick protective oxide walls are formed by first forming a trench in the polycrystalline silicon layer, and then oxidizing the exposed portions of the poly layer within this trench. Underlying portions of the poly layer are then removed, with the remaining portions of the poly layer forming poly gates and poly interconnects having thick protective oxide walls.

Both the mask used to form the source-drain contact openings and the mask used to form the polysilicon interconnect contact openings utilize relatively large openings to assure registration or self-alignment with the desired contact areas. The protective layer provides protection for the gate areas during the formation of the contact openings and assures against circuit shorts between metallization contacts, gates, polysilicon lines and source-drain regions. With the added internal protection of this layer, the masking tolerances required to properly align polysilicon gates, polysilicon lines and contact openings are substantially less stringent than in the prior art and tolerances are not required to be unusually close in placing the contact masks for forming the contact openings. The invention thus greatly reduces the problem of producing integrated circuit devices with more closely packed elements per unit area and yet a higher yield.

In summary, the objects of the invention are: to provide an improved method for forming semiconductor devices with contacts which are self-aligned on all sides; to provide a method that will allow a reduction in the spacing between contacts, gate, source-drain regions and conductive interconnect lines and thereby facilitate production of more closely packed devices; to provide a method using standard diffusion or ion implantation techniques to dope source-drain regions; to provide a method that can be easily controlled with standard semiconductor production facilities; and to provide a method that will significantly increase the production yield on high density large-scale semiconductor devices with self-aligned contacts.

BRIEF DESCRIPTION OF THE DRAWINGS

FIG. 1 is a plan view of a typical MOS transistor structure with contacts formed as in the prior art;

FIG. 2 is a plan view of an MOS transistor structure formed with self-aligned contacts;

FIGS. 3a–18a illustrate the steps for forming self-aligned contacts for a semiconductor device according to one embodiment of the present invention;

FIGS. 3b–19b illustrate the steps for forming self-aligned contacts for a semiconductor device using a second embodiment of the present invention;

FIGS. 3c–14c illustrate the steps for forming self-aligned contacts for a semiconductor device using a third embodiment of the present invention;

FIGS. 3d–13d illustrate the steps for forming self-aligned contacts for a semiconductor device using a fourth embodiment of the present invention; and FIGS. 3e–12e illustrate the steps for forming self-aligned contacts for a semiconductor device using a fifth embodiment of the present invention.

DETAILED DESCRIPTION

Figure 7A:
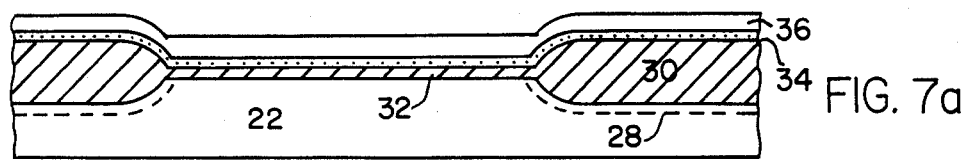

With reference to the drawings, FIG. 1 illustrates in plan view a prior art MOS transistor 10 having non-self-aligned source contact 12, drain contact 14, and gate contact 16. Each source contact 12, drain contact 14, and gate contact 16 must cover a minimum area in order to provide a reliable low resistance electrical connection. Because of alignment tolerances in forming such contacts using prior art fabrication techniques, it is necessary for the underlying source-drain region 18 to be considerably larger than the minimum contact area in order to assure proper registration of the contacts. For example, in order to produce a drain contact 14 having the minimum required contact area, a uniform tolerance around all sides of the contacts (shown at $L_1$ and $L_2$) is required when using prior art fabrication technology. Similarly, in order to prevent electrical shorts between drain contact 14 and gate electrode 20, a predetermined minimum spacing ($L_3$) between contact edge and polysilicon edge is required when using prior art fabrication technology. These prior art tolerance requirements result in a rather large MOS semiconductor device as shown in FIG. 1. The construction of an integrated circuit containing many such prior art devices results in a large, low density integrated circuit.

The reduction in chip area that can be achieved for a single MOS transistor 10a constructed with self-aligned contacts in accordance with this invention is illustrated in FIG. 2. Contact mask 17a is formed on the wafer as shown. Of importance, the source contact 12a and the drain contact 14a, both having the minimum required area for providing a reliable low resistance electrical connection, are automatically registered with the border of the source-drain region 18a and the border of poly gate region 20a, as shown. Similarly, the gate contact 16a, also having the minimum required area, is automatically registered with the poly gate region 20a. The tolerances $L_1$, $L_2$ and $L_3$ are reduced to zero, and each source-drain region 18a and poly region 20 can have reduced dimensions in width and in length compared to the widths and lengths heretofor possible using prior art fabrication techniques. Also, because each contact is self-aligned (i.e., completely contained within the region to be contacted, even though the oversized contact mask exposes areas surrounding the region to be contacted), the spacing between contacts and the spacing between a contact and an adjacent conductive area can be reduced from the spacing required in prior art devices, thereby further decreasing the overall chip area required for a semiconductor device constructed in accordance with this invention.

First Embodiment

The technique for making such a semiconductor device with self-aligned contacts according to one embodiment of the present invention, as well as the resulting structure, will now be described relative to FIGS. 3a–18a.

As shown in FIG. 3a, a semiconductor substrate 22, such as a wafer of P conductivity type silicon material having <100> crystal orientation and a resistivity within the range of approximately 25 to 50 ohm-cm serves as the starting material. Other suitable substrates may be used. Substrate 22 is covered in a well-known manner with an initial oxidation layer 24 of approximately 500–1000 Å. For example, oxide layer 24 may be formed on substrate 22 by thermal oxidation in a dry oxygen atmosphere for approximately 10–15 minutes at approximately 1050°. In a well-known manner, a second layer 26 of silicon nitride of approximately equal thickness is formed on oxide layer 24. Silicon nitride layer 26 is formed by conventional low pressure chemical vapor deposition techniques well known in the semiconductor industry, such as described by Rosler in an article entitled "Low Pressure CVD Production Processes for Poly, Nitride and Oxide", *Solid State Technology*, April 1977, pages 63–70, which is hereby incorporated by reference.

Using a field oxide mask (not shown), the layers 24 and 26 are patterned (FIG. 4a) by first removing nitride 26 from the field areas using well-known techniques (e.g., selectively etching with phosphoric acid). If desired, oxide 24 is then removed from the field areas using well-known methods such as etching with buffered hydrofluoric acid. The field areas are then doped with a suitable dopant such as Boron (as indicated by the dashed lines 28) to a doping level suitable for achieving the desired field threshold levels. If desired, the field is doped by either well-known diffusion or ion implant techniques. Of importance, if oxide 24 is not removed from the field areas, the field is doped by ion implantation through the oxide 24. For a typical field threshold level of 12 volts, a doping level of approximately $5.3 \times 10^{12}$ ions/cm$^2$ is used.

As shown in FIG. 5a, a relatively thick (approximately 8000–10,000 Å) field oxide 30 is now grown in the field areas, for example, by thermal oxidation in wet oxygen at approximately 1000° C. for approximately 90 minutes. This field oxide growth drives the field dopants 28 further into the substrate 22 under the field oxide 30. In a typical semiconductor structure, the field oxide 30 is configured as shown in FIG. 5a to form holes or openings defining the active areas 99 within which MOS transistors are to be formed. The formation of a typical field oxide of this type is described, for example, in U.S. Pat. No. 3,936,858.

After field oxide 30 is formed, the original nitride layer 26 and the original gate oxide layer 24 are removed (not shown) by suitable etchants, as previously described. Thereafter, the wafer is oxidized, for example, in a dry oxygen atmosphere containing a small amount (e.g. 2–3 percent) HCl at approximately 1050° C. for approximately twenty (20) minutes forming a new gate oxide layer 32 of approximately 500 Å thickness within the active area. The thickness of field oxide 30 is also increased a slight amount during this oxidation. This increase in the field oxide thickness is unimportant.

As shown in FIG. 6a, a thin (e.g. 150–300 Å) silicon nitride layer 34 is formed over the entire device surface, including the gate oxide layer 32 and the field oxide 30, using, for example, conventional low pressure vapor deposition techniques. In order to ensure stability of the device (i.e. to minimize charge trapping within the nitride layer) and to allow subsequent layers of photoresist to adhere more readily to the wafer, the upper surface of nitride layer 34 is oxidized in a dry oxygen atmosphere at approximately 950° C. for approximately 3–4 hours thus forming a thin (approximately 50–100 Å) layer of oxide on the surface of nitride layer 34. This thin layer of oxide is also used during the formation of contact openings to conductive polysilicon lines, as is more fully explained later. For clarity, this thin oxide layer is not shown in the Figures. Thus, FIG. 6a shows a new gate oxide 32 and nitride layer 34 of desired thicknesses. However, it is to be understood that the original gate oxide and nitride layers 26 of appropriate thicknesses shown in FIG. 3a, could be used as the gate dielectric.

Still referring to FIG. 6a, masking and appropriate enhancement and/or depletion implants may now be performed to establish the threshold voltages of the transistors being formed.

In the next step of this embodiment of the invention, as shown in FIG. 7a, a layer 36 of polycrystalline silicon (poly) is formed to a thickness of approximately 3000–5000 Å over the entire surface of the wafer. The poly layer 36 is formed, for example, by a standard vapor deposition process well known in the semiconductor industry. Poly layer 36 is then doped with a suitable dopant (e.g. phosphorus) to increase its conductivity to approximately 20–30 ohms/square.

Figure 8A:
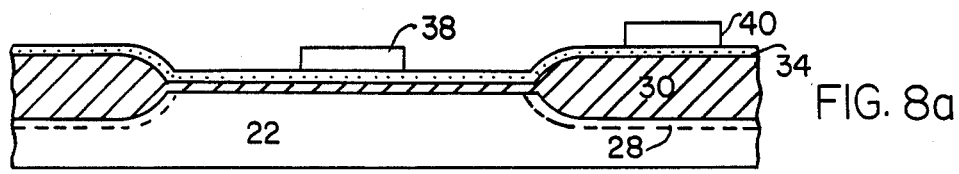
Figure 9A:
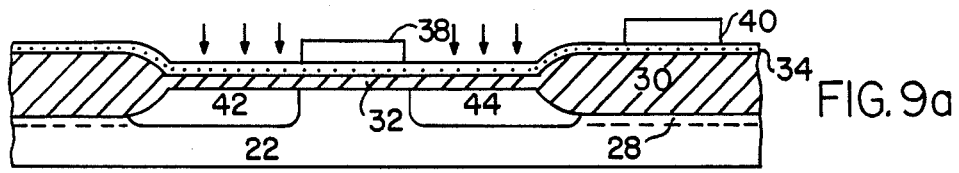

Well-known masking and etching techniques are then used to remove undesired portions of poly 36 and thus define (as shown in FIG. 8a) gate electrodes 38 within the active areas and interconnect lines 40 situated on top of the field oxide 30 and adjacent to one or more gate electrodes 38. Poly 36 is etched, for example, with a $CF_4$ plasma. At this time, all portions of poly gate 38 within the active area and on the field oxide are situated on nitride layer 34. Using well-known ion implantation techniques wherein the gate 38 serves as a mask, dopant ions are implanted in substrate 22, as represented by the vertical arrows in FIG. 9a, to form source region 42 and drain region 44 within substrate 22 just below the gate oxide 32 on opposite side of polysilicon gate 38.

Figure 10A:
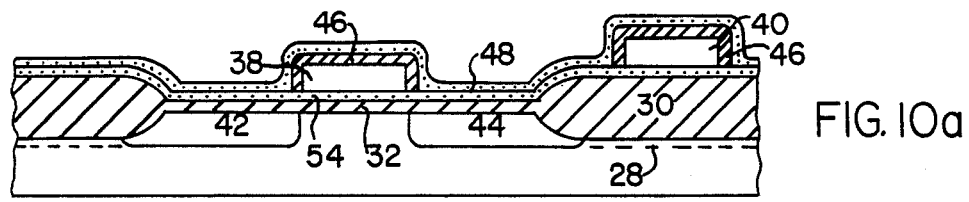

In the next step, as shown in FIG. 10a, poly gates 38 and poly interconnect lines 40 are oxidized with all other portions of the wafer protected from oxidation by nitride layer 34. A layer 46 of silicon dioxide is thus grown on all sides and also on the top of all conductive poly areas including the gate poly areas 38 and the adjacent poly interconnect lines 40. The thickness of this oxide layer 46 is approximately 3000 Å and is considerably greater than the 500 Å thickness of gate oxide 32. Oxide layers 46 protect the poly gate 38 and poly interconnect line 40 during subsequent processing. Oxide 46 is formed, for example, by thermal oxidation in wet oxygen at approximately 950° C. for approximately 60–90 minutes. Simultaneously, a thin oxide layer (not shown) is also formed on nitride layer 34, to a thickness of approximately 50–100 Å. This thin oxide layer serves a useful purpose during the formation of interconnect contacts, as will be more fully explained later.

In the next step, also shown in FIG. 10a, a thin protective nitride layer 48 is formed to a thickness of approximately 100–300 Å, for example, using the low pressure chemical vapor deposition techniques previously described. Nitride layer 48 covers the entire structure, including the field oxide 30, the source region 42, drain region 44, the poly gate 38 and poly interconnect line 40. Nitride layer 48 will later serve to provide vital protection for field oxide 30 and protective poly oxide 46 during subsequent process steps.

Figure 11A:
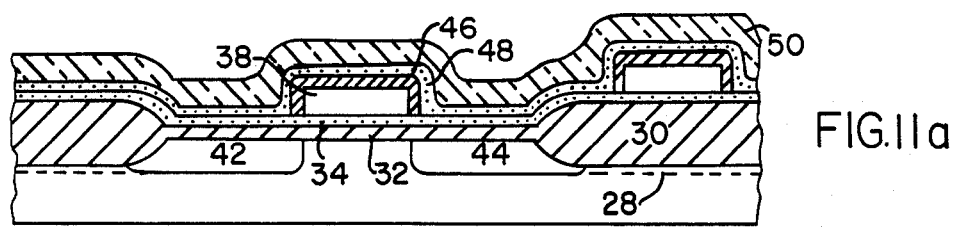

Following the formation of nitride layer 48, the entire wafer, as shown in FIG. 11a, is covered with a relatively thick (approximately 10,000 Å) layer of phosphosilicate glass (PVX) 50 using well-known techniques. PVX 50 serves to electrically insulate underlying areas from to-be-formed metallization. PVX 50 is formed, for example, by conventional vapor deposition techniques that are well-known in the semiconductor industry.

Figure 12A:
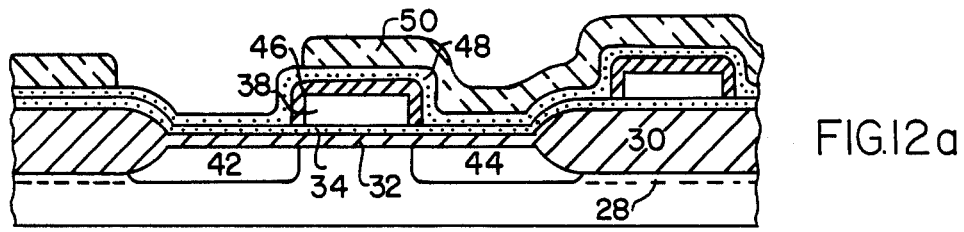
Figure 13A:
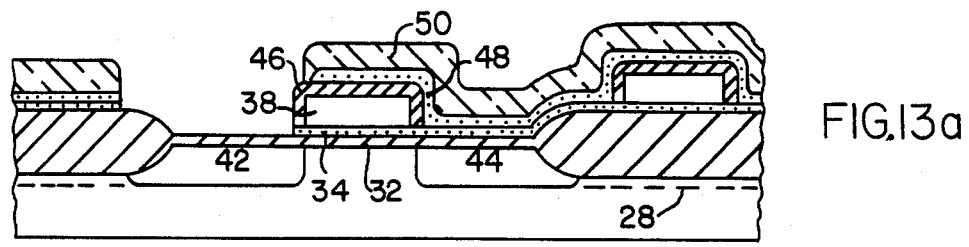

A first contact mask (not shown) for the source-drain contacts is applied to the PVX layer 50 and a suitable etchant (e.g. buffered hydrofluoric acid) is used to remove the PVX layer 50 in the source-drain contact areas, as shown in FIG. 12a. The buffered hydrofluoric acid used to etch PVX 50 does not affect nitride layers 34 and 48, and thus oxide layers 32 and 46 and the thin oxide layer (not shown) formed on nitride layer 34 are protected during the relatively long (i.e. approximately 3 minutes) etch of PVX layer 50. Prior art methods did not protect oxide layers 32 and 46 during this etch, thus possibly allowing damage to oxide layers 32 and 46. A suitable etchant (e.g., $CF_4$ plasma) is then used to etch the nitride layers 34 and 48 in the source-drain contact opening, as shown in FIG. 13a. Of importance, the use of a $CF_4$ plasma as the nitride etchant does not significantly attack PVX 50, field oxide 30, or protective oxide 46 because they are relatively thick. The plasma etchant also removes within the contact opening the thin oxide layer (not shown) formed on nitride layer 34, while not damaging the gate oxide 32, because gate oxide 32 is protected by nitride 34 during the etching, except for a very brief period after the nitride 34 is removed.

Figure 14A:
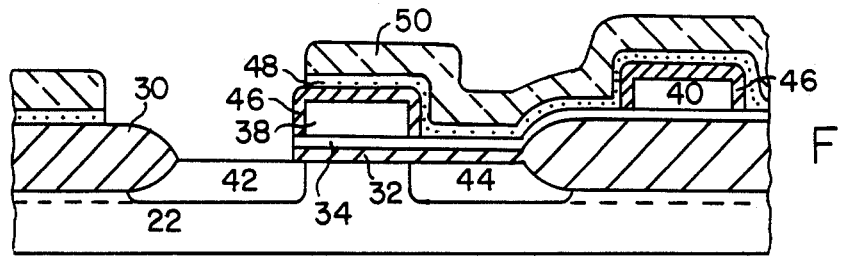
Figure 15A:
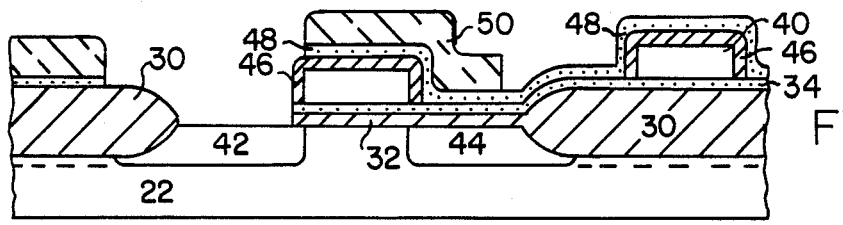
Figure 16A:
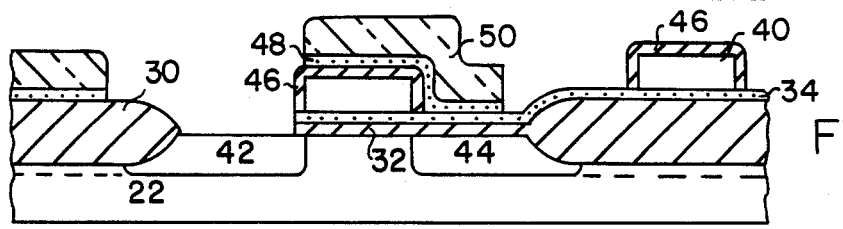

Gate oxide 32 is then removed from the contact area such as by etching for approximately 1 minute with buffered hydrofluoric acid, as shown in FIG. 14a. Of importance, oxide layer 46 protecting poly gate 38 is significantly thicker than the gate oxide 32 being removed, thus preventing damage to protective oxide 46 during removal of gate oxide 32. With protective oxide 46 intact, source-drain contact metallization is later deposited without electrically shorting to poly gate 38. Without the use of protective nitride layer 48, protective oxide 46 would be damaged during the time consuming etching of the PVX layer 50, thus possibly allowing the formation of electrical shorts between to-be-formed source contact metallization and gate 38.

Figure 17A:
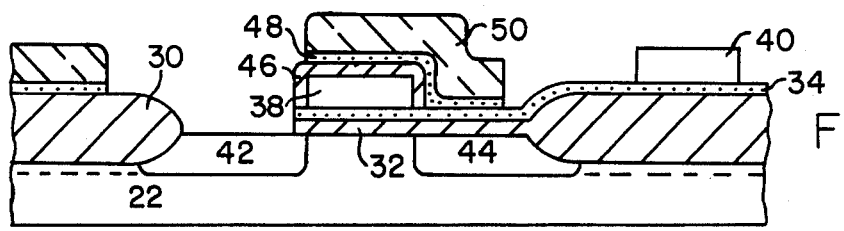

A second contact mask (not shown) is now applied to the wafer in the same manner as the first contact mask to form contact openings for electrical connection to poly interconnect lines 40. This second contact mask simultaneously covers and protects the layers exposed by the previously formed source-drain contact opening. PVX layer 50 is removed (FIG. 15a) from the interconnect contact openings using a suitable etchant, such as buffered hydrofluoric acid. Nitride layers 34 and 48 protect gate oxide 32, field oxide 30, and interconnect protective oxide 46 during the relatively long (e.g. 3 minutes) etching of PVX layer 50. Nitride layer 48 is then removed (FIG. 16a) using a suitable etchant, for example, phosphoric acid. The use of phosphoric acid, rather than the $CF_4$ plasma used in conjunction with the first contact mask as previously described, allows nitride layer 48 to be etched while preventing etching of the thin oxide layer (not shown) formed on nitride layer 34. The thin oxide layer (not shown) formed on nitride layer 34 serves to prevent etching of nitride layer 34 during the removal of nitride layer 48, such that nitride layer 48 is removed, thus exposing protective oxide 46, while leaving intact nitride layer 34. Protective oxide 46 is then removed from poly line 40 (FIG. 17a), for example, using buffered hydrofluoric acid, thus exposing poly interconnect line 40. At the same time, the thin oxide layer (not shown) previously formed on poly layer 34 is removed. Of importance, nitride layer 34 prevents damage to gate oxide 32 and field oxide 30 during the removal of protective oxide 46, thus preventing electrical shorts between the to-be-formed metal interconnects and source-drain region 44. This leaves the device, as shown in FIG. 17a, with poly gate 38 protected by PVX layer 50, nitride layer 48, and protective oxide 46. Contact openings expose the source area 42 and poly interconnect line 40. Of course, the poly interconnect contact opening may be formed prior to the formation of the source-drain contact openings, if desired.

Figure 18A:
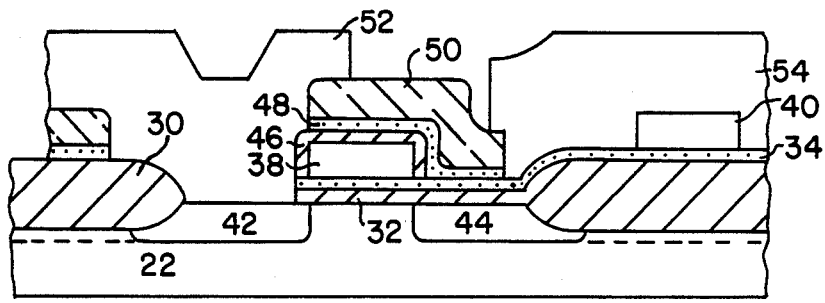

Standard fabrication techniques are now used to deposit a conductive material such as metal in the contact areas to form, as shown in FIG. 18a, contacts 52 and 54 as part of a desired interconnect pattern (typically metal) on the semiconductor device. Generally, metallization is formed on the semiconductor device by evaporating metal (typically aluminum or an alloy of aluminum) on the surface of the device and patterning this metal with appropriate masking and etching techniques. Suitable etchants for the patterning of metal include a well-known metal etch solution comprised of acetic, nitric and phosphoric acids. A scratch protection layer (not shown) is then formed in a well known manner over the surface of the device. Such a scratch protection layer is typically formed of PVX or silicon nitride. Openings are then formed in the scratch protection layer in a well known manner to allow electrical interconnection to external devices.

Second Embodiment

In a second embodiment of the present invention, illustrated by FIGS. 3b-18b, the initial steps of FIGS. 3b-6b inclusive are identical to those of FIGS. 3a-6a. However, this second embodiment utilizes well-known diffusion techniques for forming the source and drain regions. The various layers are formed and removed using the process previously described in regard to the first embodiment and thus the description of these steps will not be repeated.

As shown in FIG. 7b field oxide 30 and gate oxide 32 are formed on a substrate 22. Poly layer 36 having a typical thickness in the range of 3000-5000 Å is formed on the wafer over the nitride layer 34, for example, by well-known conventional low pressure chemical vapor deposition. Poly layer 36 is then doped as previously described to increase its conductivity. Thereafter, a nitride layer 56 having a thickness of approximately 1000-2000 Å, and thus considerably thicker than the gate nitride layer 34, is formed as previously described on the polysilicon layer 36.

As shown in FIG. 8b, the polysilicon layer 36 is patterned in a two step process into gate areas and interconnect lines by using a poly mask (not shown) and well-known etching techniques which first remove the unwanted portions of nitride layer 56, for example, by etching with phosphoric acid. The unwanted portions of poly layer 36 are then removed, for example, by etching with a $CF_4$ plasma. This leaves the structure shown in FIG. 8b having a doped polysilicon gate 38 within an active area surrounded by field oxide 30, and an adjacent poly interconnect line 40 situated on the field oxide 30. Both poly gate 38 and poly interconnect line 40 have the nitride layer 56 remaining on their top surfaces.

In the next step, shown in FIG. 9b, the poly gate element 38 and the poly interconnect line 40 are oxidized thus forming an oxide layer 46 on their sides having a thickness of approximately 3000 Å. This oxidation is accomplished, for example, by simple thermal oxidation in a chamber in accordance with well-known techniques. Now, the source region 42 and drain region 44 are formed by diffusion techniques. First, using suitable well-known masking and etching techniques, the gate nitride layer 34 is etched away from every surface except the bottom of poly gate 38 and poly interconnect line 40, as shown in FIG. 10b. Thicker nitride layer 56 remains on the tops of gate 38 and interconnect line 40. Then, as shown in FIG. 11b, the gate oxide layer 32 is removed in all the areas surrounding the poly gate 38. Well-known diffusion techniques are now used to form the source region 42 and drain region 44. Following this diffusion, a new thin gate oxide layer 58 is formed, as shown in FIG. 12b, over the diffused source region 42 and drain region 44, to a thickness of approximately 500 Å.

A thin protective nitride layer 60 (e.g., 150–300 Å) is applied to the structure, as shown in FIG. 12b. Nitride layer 60 is thus much thinner than the nitride layer 56 and, as with the previous embodiment, layer 60 extends over the entire surface of the chip including the field oxide 30, source region 42, drain region 44, and the nitride covered poly gate 38 and poly interconnect line 40.

Figure 14B:
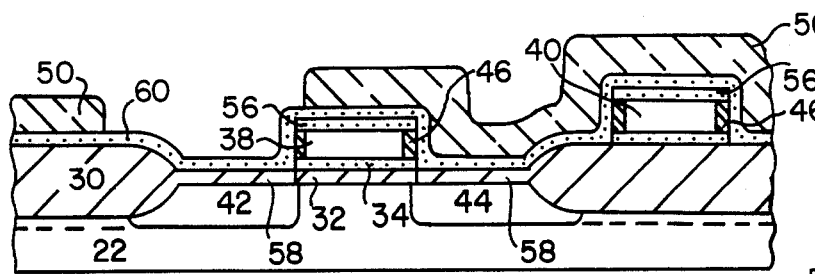
Figure 15B:
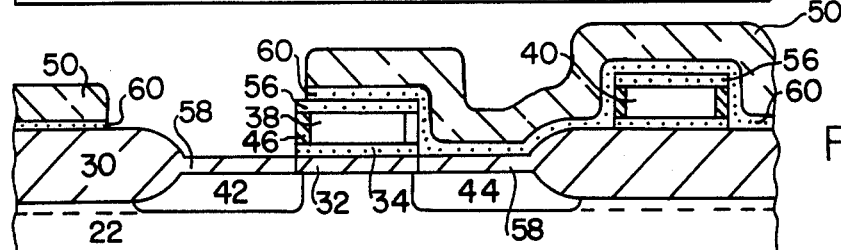
Figure 16B:
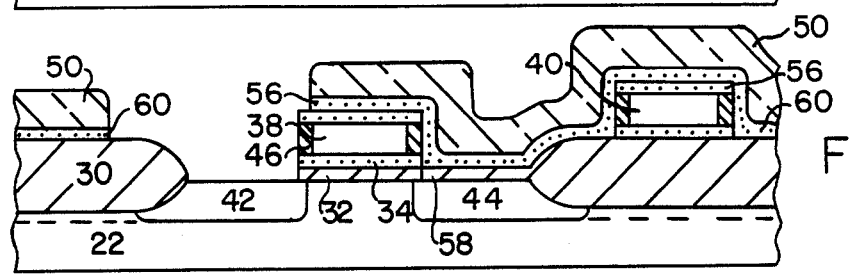

Now, PVX layer 50 of approximately 10,000 Å is applied (FIG. 13b) using well-known techniques. Using contact masks in the same manner as previously described with respect to the first embodiment of this invention, portions of PVX layer 50 are removed, as shown in FIG. 14b, to form the source-drain contacts. Nitride layer 60 is then removed in the contact area (FIG. 15b) in the same manner as in the previously described first embodiment, without the etchant used to remove the nitride affecting field oxide 30, PVX 50, gate oxide 58 and protective oxide 46. Gate oxide layer 58 is then removed (FIG. 16b) from the contact area in the same manner as used in the previously described first embodiment. Of importance, gate oxide 58 is significantly thinner than oxide layer 46 protecting poly region 38. Thus, protective oxide layer 46 is not damaged during the removal of the gate oxide 58.

Figure 17B:
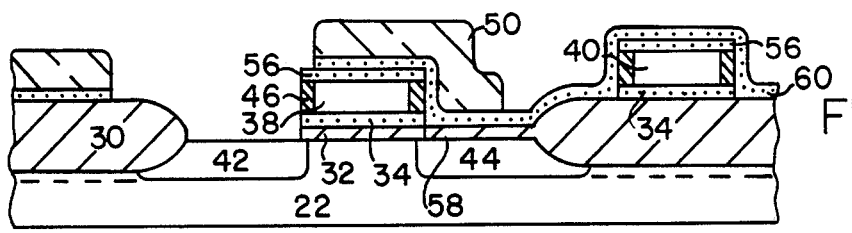
Figure 18B:
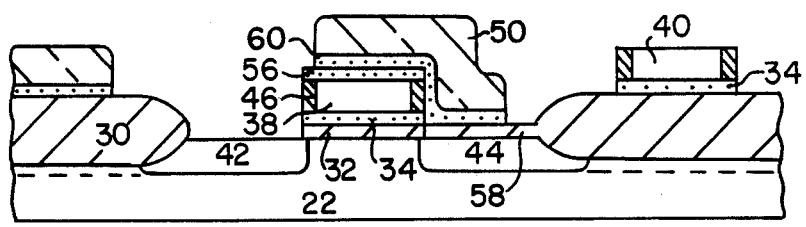

A second contact mask (not shown) is applied to the surface of the device for the purpose of providing contact openings to selected portions of poly interconnect line 40 and protecting the layers exposed by the source-drain contact opening. First, PVX 50 is removed from the poly interconnect line contact area, as shown in FIG. 17b. Nitride layers 60 and 56 are then removed from the poly interconnect line contact area, as shown in FIG. 18b. Of importance, the portion of gate oxide 58 located within the poly interconnect line contact opening is not damaged during the removal of protective nitride layer 34 because the etchant used to remove the nitride does not attack oxide.

Figure 19B:
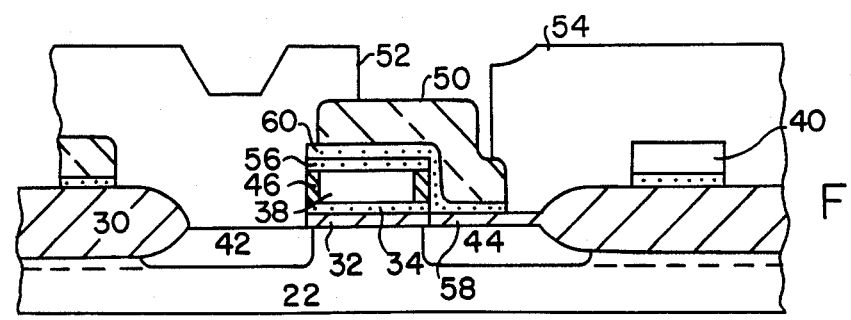
Figure 8C:
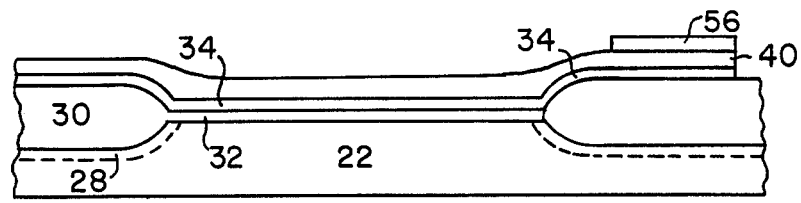

With contact openings thus formed, the metal contacts 52 and 54 are formed in a well-known manner, as shown in FIG. 19b. Because oxide 46 protecting poly gate 38 is not damaged during the formation of the contact, shorts between metallization 52 and poly 38 are prevented. Similarly, because gate oxide 58 over drain 44 is not damaged during the formation of the poly interconnect line contact, shorts between metallization 54 and drain 44 are prevented.

Third Embodiment

Figure 9C:
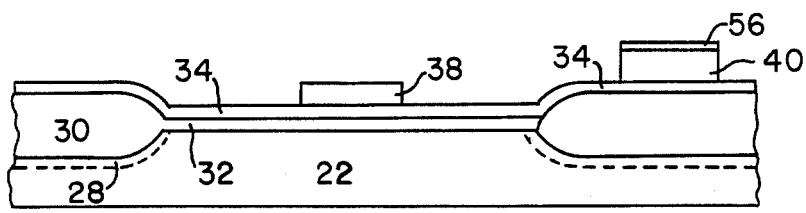

In a third embodiment of the present invention, illustrated by FIGS. 3c–18c, the initial steps of FIGS. 3c–7c inclusive are identical to those FIGS. 3b–7b, and thus the description of these steps will not be repeated. In the third embodiment, an oversized poly contacts mask is used as shown in FIG. 8b to remove nitride 56 except where it is desired to form electrical contacts to polysilicon connecting lines 40. The undesired portions of nitride 56 are removed, for example, by etching with hot phosphoric acid. As shown in FIG. 9c, a poly mask is then used to pattern poly layer 40, thus defining poly gate 38 and poly interconnect lines 40. With the poly contact mask in place, undesired portions of nitride layer 56 which remain due to the use of the oversized poly contact mask are removed, for example, by etching with hot phosphoric acid. The unmasked portions of poly layer 40 are then removed, for example, by etching with a CF4 plasma.

Next an oversized contact mask (not shown) is formed in a well known manner to protect those regions which, several steps later, will be diffused with impurities to form a source-drain region 42. Nitride layer 34 is then removed from all regions not protected by the contact mask using a suitable etchant such as carbon tetrafluoride plasma. Gate oxide 32 which is then exposed is removed from the to be formed N+ source-drain area 44, for example by etching for approximately one minute with buffered hydrofluoric acid. The nitride 34 and oxide 32 remain over source-drain region 42, as shown in FIG. 10c.

Figure 10C:
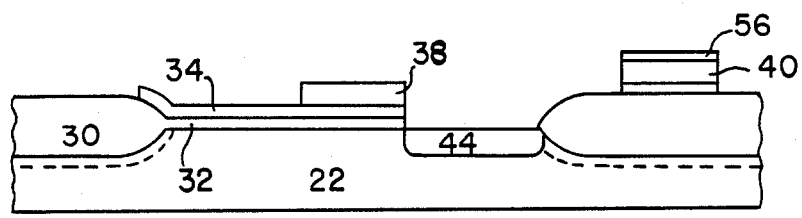
Figure 11C:
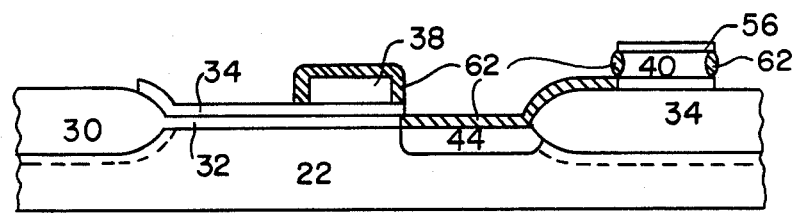

Next, as shown in FIG. 10c, an N+ region 44 is formed in the exposed portion of substrate 22, typically by a standard diffusion or ion implantation process. After the N+ diffusion, a thick oxide layer 62 is formed, for example, by oxidation in wet oxygen at approximately 975° C. for approximately 20 minutes, to a thickness of approximately 3000 angstroms over all exposed silicon (44) and polysilicon (38 and 40) areas. Field oxide 30 also increases in thickness, but this is unimportant. Thus, the gate 38, interconnect 40 and region 44 are covered by a thick protective layer of oxide as shown in FIG. 11c, except in the areas where contact to poly line 40 and diffused regions (not shown) are to be made, which remain covered with nitride 56.

Figure 12C:
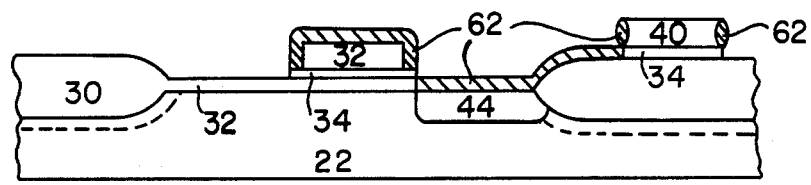
Figure 13C:
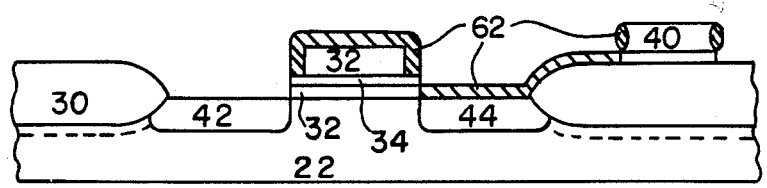

Next, the remaining exposed layers of nitride 34 and 56 are removed as shown in FIG. 12c, for example by etching with hot phosphoric acid. The exposed portions of thin gate oxide layer 32 are then removed, for example by etching in buffered HF without causing significant reduction of thicker oxide layer 62. The exposed source-drain region 42 is then formed, for example by the same standard diffusion or ion implantation techniques previously used for region 44. During the formation of region 42, dopants are also introduced into the exposed portion interconnect 40, but this is not important. The structure at this stage is shown in FIG. 13c.

A layer of PVX 50 approximately 10,000 Å thickness is now deposited over the surface of the wafer using, for example, well known vapor deposition techniques. PVX 50 is then masked and patterned, for example, by etching with buffered HF to form a mask for metal deposition.

Standard fabrication techniques are now used to deposit a conductive material such as metal in the contact areas to form contacts 52 and 54 as part of a desired interconnect pattern on the semiconductor device. Generally, metallization is performed by evaporating metal (typically aluminum or an alloy of aluminum) on the surface of the device and patterning this metal with appropriate masking and etching techniques. Suitable etchants for the patterning of metal include a well-known metal etch solution comprised of acetic, nitric and phosphoric acids. The resultant structure, shown in FIG. 14c, has a self-aligned contact 52 to N+ region 42, and a self-aligned contact 54 to poly interconnect line 40. Oxide layer 62 allows the contacts to be formed closer to poly areas 38 and 40 than heretofore possible, while preventing short circuits. The semiconductor device is then completed by well known techniques for forming a scratch protection layer and openings for external electrical connection to selected portions of the metal interconnects.

Fourth Embodiment

In a fourth embodiment of the present invention, illustrated by FIGS. 3d–13d, the initial steps of FIGS. 3d–5d inclusive are identical to those of FIGS. 3a–5a and thus the description of these steps will not be repeated. In the fourth embodiment, after the step of forming field oxide 30 as shown in FIG. 5d, nitride layer 26 and gate oxide layer 24 (FIG. 4d) are removed by suitable etchants, as previously described. Thereafter, the wafer is oxidized, for example, in a dry oxygen atmosphere at approximately 1050° C. for approximately twenty (20) minutes, forming a new gate oxide layer 32 of approximately 500 Å thickness within the active area 99. The thickness of field oxide 30 is also increased a slight amount during this oxidation, although this increase in the field oxide thickness is unimportant.

It is to be understood that the original gate oxide 24 of appropriate thickness shown in FIG. 3d could be left in place and used as the gate dielectric 32.

Enhancement and depletion implants are now performed in a well known manner, if desired, to establish the desired threshold voltage within the active area 99.

In the next step as shown in FIG. 6d, a layer 36 of polycrystalline silicon (poly) is formed to a thickness of approximately 3000-5000 Å over the entire surface of the wafer. The poly layer 36 is formed, for example, by a standard vapor deposition process well known in the semiconductor industry. Poly layer 36 is then doped with a suitable dopant (e.g. phosphorus) to increase its conductivity to approximately 20-30 ohms/square.

Well known masking and etching techniques are then used to remove undesired portions of poly 36 and thus define (as shown in FIG. 7d) gate electrodes 38 within the active areas, and interconnect lines 40 situated on top of the field oxide 30 and adjacent to one or more gate electrodes 38. Poly 36 is etched, for example, with a CF$_4$ plasma.

The substrate 22 is then implanted with nitrogen ions, as also shown in FIG. 7d, using well known ion implantation techniques, such as implantation of nitrogen ions at an energy level of 50 to 150 KEV to provide sufficient nitrogen in the top surface of poly gate 38 and poly interconnect 40 to allow formation of silicon nitride in the next processing step.

In the next step, the implanted nitrogen ions are annealed, for example at 1100°-1200° C. for 30 minutes in a nitrogen atmosphere. This process results in a layer 47 of silicon nitride having a thickness of approximately 1000-2000 Å being formed on those areas where polysilicon 36 is exposed, e.g. the gates 38 and interconnects 40 as shown in FIG. 8d. Elsewhere, oxide surfaces 30 and 32 prevent the formation of nitride.

The substrate 22 is then etched, for example with buffered HF for approximately two to three minutes to remove the gate oxide 32 over the source-drain regions, without attacking nitride 47 and without significantly reducing the thickness of field oxide 30. The source-drain regions 42 and 44 are then formed by well known diffusion or ion implantation techniques. Following this formation of source-drain regions 42 and 44, a new thin gate oxide layer 58 is formed to a thickness of approximately 500 Å over the diffused source region 42 and drain region 44 as shown in FIG. 9d, for example, by oxidation in wet oxygen at approximately 950° C. for approximately 15 minutes. Of importance, gate oxide 32 need not be removed if source-drain regions 42 and 44 are formed by ion implantation and in which case gate oxide 32 can be used in place of oxide 58.

Figure 10D:
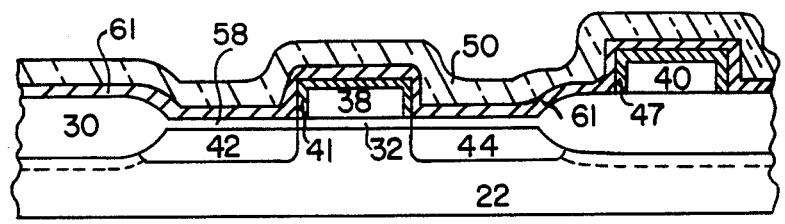
Figure 11D:
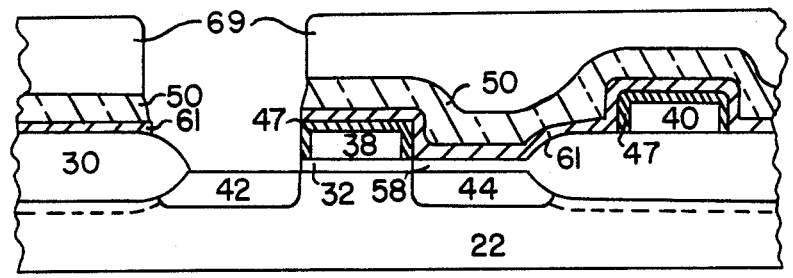
Figure 12D:
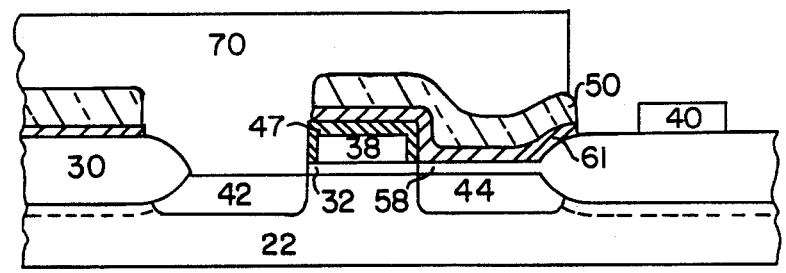

As shown in FIG. 10d, a layer of oxide etch stopper 61 is next deposited over the entire surface of the substrate by well known techniques, for example to a thickness of approximately 1000 Å, for example by chemical vapor deposition or evaporation. This oxide etch stopper 61 is, for example, either silicon carbide, polycrystalline silicon, or aluminum oxide, or any other suitable material which can be etched without damaging oxide or silicon nitride. Silicon carbide, polycrystalline silicon and aluminum oxide are etched, for example, with a suitable plasma which does not effect oxide or nitride. Now, PVX layer 50 of approximately 10,000 Å, also shown in FIG. 10d, is formed using, for example, well-known vapor deposition techniques as previously described.

Using a contact mask 69 in the same manner as previously described with respect to the first embodiment of this invention, portions of PVX layer 50 are removed to form a source-drain contact window over region 42. Etch stopper 61 is then removed in the contact area without the etchant used to remove the etch stopper affecting field oxide 30, PVX 50, gate oxide 58 or protective nitride 47. Gate oxide layer 58 is then removed from the contact area for example by etching with buffered HF, which does not affect nitride 47, and does not significantly attack PVX 50 or field oxide 30, resulting in the structure shown in FIG. 11d.

A second contact mask 70 is applied to the surface of the device for the purpose of defining contact openings to selected portions of poly interconnect line 40 and protecting the layers exposed by the source-drain contact opening. First, PVX 50 is removed from the poly interconnect line 40 contact area, for example, by etching with buffered HF. Second, oxide stopper 61 is removed, for example, by using a suitable plasma etch, as previously described, and third, nitride layer 47 is removed from the poly 40 contact area for example by etching with hot phosphoric acid, yielding the structure shown in FIG. 12d. Of importance, the portion of gate oxide 58 located within the poly interconnect line contact opening is not damaged during the removal of protective nitride layer 47 because the etchant used to remove the nitride does not attack oxide. Furthermore, gate oxide 58 is protected by PVX 50 and stopper 61.

Figure 13D:
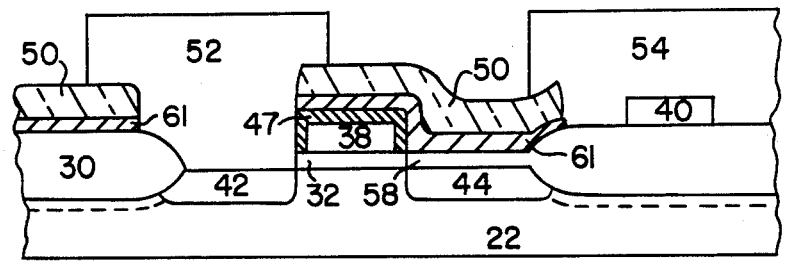

Mask 70 is then removed. With contact openings thus formed, the metal contacts 52 and 54 are formed in a well-known manner. Because nitride 47 protecting poly gate 38 has not been damaged during the formation of either contact 52 or contact 54, shorts between metallization 52 and poly gate 38 are prevented. The structure with metal contacts formed is shown in FIG. 13d. The semiconductor device is then be completed by forming a scratch protection layer and openings through the scratch protection layer allowing external electrical connection, as previously described.

In an alternative form of the fourth embodiment, gate oxide 32 is removed from the to be formed source-drain regions 42 and 44 prior to the implantation of nitrogen ions (FIG. 7d). The source-drain regions 42 and 44 are then formed using well known techniques. Nitrogen ions are then implanted into the surface of poly gate 38, poly interconnect 40 and source-drain regions 42 and 44 and the device is annealed, thus forming a thin nitride layer on the surface of source-drain regions 42 and 44. The sides of poly gate 38 and poly interconnect 40 are then oxidized using well known techniques, thus causing poly gate 38 and poly interconnect 40 to be protected by oxide on their sides. Thereafter, the nitride is removed from the source-drain regions and a new gate oxide is formed on the source-drain regions 42 and 44 using well known techniques. The remaining process steps are the same as previously described in conjunction with FIGS. 10d–13d.

Fifth Embodiment

Figure 7E:
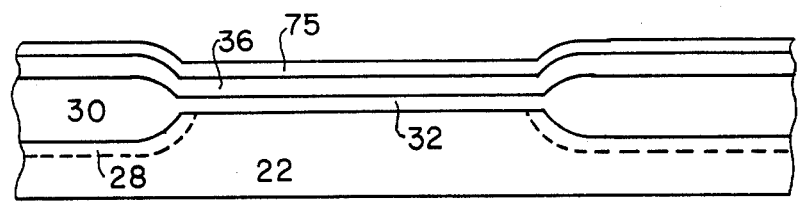

In a fifth embodiment of the present invention, illustrated by FIGS. 3e–14e, the initial steps of FIGS. 3e–6e inclusive are identical to those of FIGS. 3d–6d, and thus the description of these steps will not be repeated. Following the step shown in FIG. 6e, a layer of nitride 75 approximately 2000 Å thick is formed covering poly layer 36 (FIG. 7e). Nitride layer 75 is formed, for example, by well known techniques such as low pressure chemical vapor deposition, as previously described.

Figure 8E:
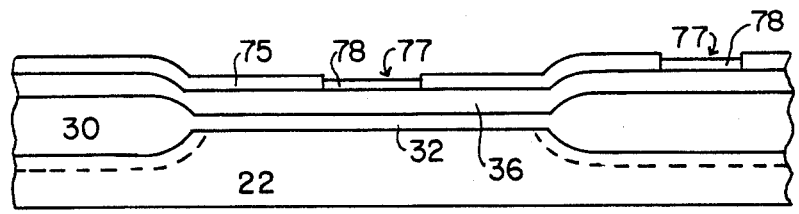

A mask (not shown) is then applied to the surface of a device to define locations where poly gate and poly interconnect lines are to be formed. Portions of nitride layer 75 are removed, thus exposing poly layer 36 in those areas where poly gates and poly interconnect lines are to be formed. A thin (approximately 200–500 angstroms) oxide layer 78 is then formed on the exposed portions of poly layer 36. Oxide layers 78 are formed, for example, by oxidation in wet oxygen at approximately 950° C. for approximately 5 minutes. The resulting structure is shown in FIG. 8e.

Figure 9E:
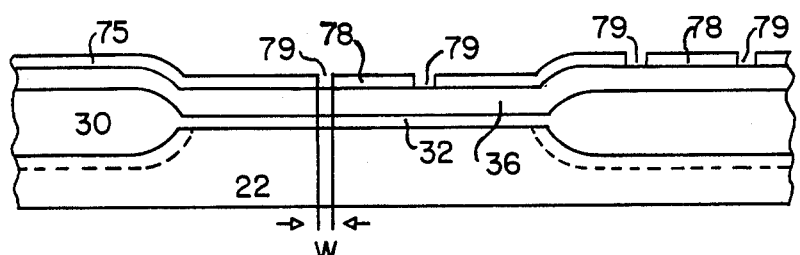

As shown in FIG. 9e, portions of nitride layer 75 are removed, for example, by etching nitride 75 with hot phosphoric acid. The width W of these openings 79 is typically approximately 500 Å–1000 Å, thus exposing portions of poly layer 36 adjacent to oxide layer 78. The thickness of the remaining layer of nitride 75 is decreased by approximately 500–1000 Å by this etch, but this decrease in thickness is unimportant.

Figure 10E:
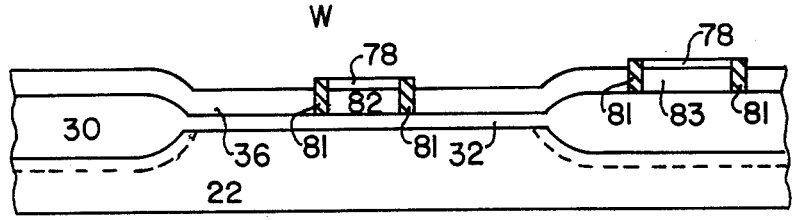

The exposed portions of poly layer 36 is then etched to a depth of approximately three-fourths the thickness of the poly 36 (i.e. etched to a depth of approximately 2500–3000 Å), for example by etching with a solution of nitric, acetic, and hydrofluoric acids. The exposed portions of poly layer 36 are then oxidized forming oxide regions 81 as shown in FIG. 10e. This oxidation is performed, for example, by subjecting the device to a wet oxygen environment at approximately 950° C. for approximately 20–25 minutes. Nitride layer 75 is then removed, for example, by etching with hot phosphoric acid, as shown in FIG. 10e.

Figure 11E:
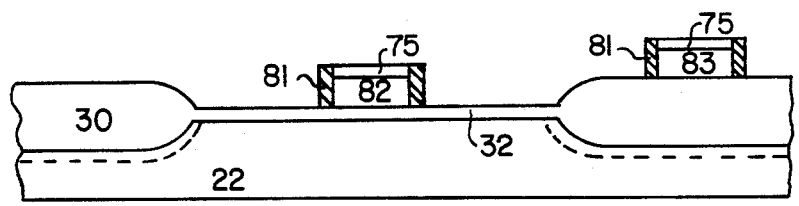
Figure 12E:
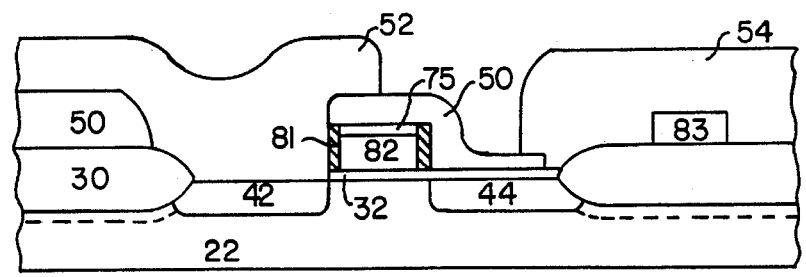

Exposed portions of poly layer 36 are then removed, for example, by etching with a $CF_4$ plasma. As shown in FIG. 11e, poly gate region 82 and poly interconnect 83 are each protected on their top and sides with oxide region 75 and 81, respectively. At this time, fabrication of the device is completed in accordance with the steps shown in FIG. 12e, by the formation of PVX layer 50, contact openings within PVX layer 50, and metallization interconnects 52 and 54, as previously described in my other embodiments of this invention.

By utilization of this invention, it is possible to produce large-scale semiconductor devices with a multiplicity of MOSFET elements having self-aligned contacts and therefore requiring a minimum of chip area in a closely-packed array. For example, in a typical random access memory (RAM) fabricated using prior art techniques, the area required for a single memory cell was 1344 square microns, whereas, with the self-aligned contacts made possible using the present invention, the same memory cell has an area of only 950 square microns, a reduction in area of approximately 30%. Yet, with the method of the present invention, the yield of such closely-packed devices with self-aligned contacts can be even higher than with prior art devices because the internal protective nitride layers 48 (FIGS. 10a–18a), 60 (FIGS. 12b–19b) and 47 (FIGS. 8d–13d) and thick oxide 62 (FIGS. 12c–15c), and 81 (FIGS. 10e–12e) maintain circuit integrity during critical process steps by preventing shorts or failures heretofore caused during the various process steps.

While silicon nitride and thick oxide are preferred material for the protective layers, other materials could be used such as silicon carbide, aluminum oxide and polycrystalline silicon.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A method for fabricating an integrated circuit semiconductor device having a plurality of field effect transistor (FET) elements with self-registering electrical contacts on their source-drain regions and on their device interconnection lines, said method comprising the steps of:

forming a patterned layer of field oxide on a semiconductive substrate of a first conductivity type to form active areas free from field oxide on the substrate surface for the formation of said FET elements;

forming a relatively thin gate dielectric layer within said active areas;

forming a first layer of protective material covering the top of each said integrated circuit device;

forming a layer of conductive material over the surface of said protective material;

forming a second layer of protective material over said layer of conductive material;

removing that portion of said second layer of protective material except over parts of to-be-formed interconnection lines where electrical contacts are intended;

patterning said layer of conductive material into conductive gate electrodes over said active areas and into interconnection lines over said field oxide regions;

removing said first layer of protective material except those portions of said first protective layer which lie above to-be-formed source-drain regions to which electrical contacts are to be made;
removing that portion of said gate dielectric which is exposed;
forming, within each said active area where said gate dielectric has been removed, doped silicon source-drain regions of a second conductivity type material opposite to said first conductivity type, the boundaries of said source-drain regions being determined by the edge of said field oxide and by the edges of said gate electrodes;
forming a relatively thick third layer of protective material over all exposed areas of said substrate and of said layer of conductive material;
removing the remaining exposed portion of said first protective layer, and the remaining portion of said second protective layer;
removing that portion of said gate dielectric layer which is exposed;
forming, within each said active area where said gate dielectric has been removed, doped silicon source-drain regions of a second conductivity type material opposite to said first conductivity type, the boundaries of said source-drain regions being determined by the edge of said field oxide and by the edges of said gate electrodes;
forming a fourth layer of protective material over the entire device;
forming oversized contact openings through said fourth layer of protective material over said interconnection line and over said source-drain regions where electrical contacts are to be formed;
forming a conductive line pattern on the surface of the wafer extending into said contact openings thereby forming electrical connections with said source-drain regions and with said interconnection lines within said contact openings.

2. The method as described in claim 1 wherein said first and second layers of protective material are silicon nitride formed to a thickness in the range of 100 Å to 300 Å.

3. The method as described in claim 1, wherein said conductive gate electrodes are polycrystalline silicon and said thick third layer of protective material on the sides and top of each of said conductive gate electrodes is silicon dioxide.

4. The method as described in claim 1 wherein said source-drain regions for each said FET are formed by a diffusion process.

5. A method for fabricating an integrated circuit semiconductor device having a plurality of field effect transistor (FET) elements with self-registering electrical contacts on their source-drain regions and on their device interconnection lines, said method comprising the steps of:
forming a patterned layer of field oxide on a semiconductive substrate of a first conductivity type
to form active areas free from field oxide on the substrate surface for the formation of said FET elements;
forming a relatively thin gate dielectric layer within said active areas;
forming a layer of conductive material over the surface of the substrate;
patterning said layer of conductive material to form conductive gate electrodes over said gate dielectric layer within said active areas and interconnection lines over said field oxide regions;
forming a layer of a first protective material on the sides and top of each of said conductive gate electrodes and said interconnection lines;
forming, within each said active area, doped silicon source-drain regions of a second conductivity type opposite to said first conductivity type, the boundaries of said source-drain regions being determined by the edge of said field oxide and by the edges of said gate electrodes;
forming a layer of a second protective material over the entire device;
covering said layer of second protective material on said device with a relatively thick layer of insulating material;
forming first oversized contact openings through said insulating material where electrical contacts to said source-drain regions are to be formed;
removing said layer of second protective material within said first oversized contact openings;
removing said gate dielectric layer from the surfaces of said source and drain regions within said first oversized contact openings;
forming second oversized contact openings through said insulating material where electrical contacts to said interconnection lines are to be formed;
removing said layer of first protective material within said second oversized contact openings;
forming a conductive line pattern on the surface of the wafer extending into said first and second contact openings thereby forming electrical connections with said source-drain regions and with said interconnection lines within said contact openings.

6. The method as described in claim 5 wherein said layer of conductive material is polycrystalline silicon formed to a thickness in the range of 100 Å to 300 Å.

7. The method as described in claim 5 wherein said first layer of protective material is silicon nitride.

8. The method as described in claim 5 wherein said second layer of protective material is aluminum oxide.

9. The method as described in claim 5 wherein said second layer of protective material is silicon carbide.

10. The method as described in claim 5 wherein said gate dielectric layer is silicon dioxide.

11. The method as described in claim 5 wherein said conductive gate electrodes are polycrystalline silicon and said first layer of protective material on the sides and top of each of said conductive gate electrodes is silicon nitride.

12. The method as described in claim 5 wherein said source-drain regions are formed by ion implantation.

13. The method as described in claim 5 wherein said gate dielectric layer is removed from said active areas bounded by said gate electrodes and said field oxide, said source-drain regions for each said FET are formed by diffusion selected impurities into said source-drain regions, and a new gate dielectric layer is formed in those areas from which said gate dielectric layer was removed.

14. A method for fabricating an integrated circuit semiconductor device having a plurality of field effect transistor (FET) elements with self-registering electrical contacts on their source-drain regions and device interconnection lines, said method comprising the steps of:
forming a patterned layer of field oxide on a semiconductive substrate of a first conductivity type to form active areas free from field oxide on the substrate surface for the formation of said FET elements;

forming a relatively thin gate dielectric layer within said active areas;

forming a layer of conductive material over the surface of said substrate;

forming a first protective layer over the surface of said conductive material;

patterning said first protective layer, thereby removing portions of said protective layer to define openings within said first protective layer for the formation of gate electrodes and interconnecting lines;

forming a second protective layer within said openings, within said first protective layer;

removing the exposed surface remaining of said first protective layer to a limited depth sufficient to expose narrow portions of said layer of conductive material surrounding said second protective layer;

oxidizing the exposed portions of said conductive layer;

removing all remaining portions of said first protective layer;

removing all exposed portions of said conductive layer, exposing portions of said gate dielectric layer;

removing all exposed portions of said gate dielectric layer;

forming, within each said active area surrounded by said field oxide, doped silicon source-drain regions of a second conductivity type opposite said first conductivity type, the boundaries of said source-drain regions being determined by the edge of said field oxide and by the edges of said oxidized portions of said conductive layer;

forming a source-drain oxide layer over said source-drain regions;

covering said device with a relatively thick layer of insulating material;

forming oversized contact openings through said insulating material over said interconnecting lines and over said source-drain regions where electrical contacts are to be formed;

removing said source-drain oxide from the surfaces of said source-drain regions within said oversized contact openings where electrical contacts are to be formed; and forming a conductive line pattern on the surface of the wafer extending into said contact openings thereby forming electrical connections with said source-drain regions and with said line interconnections within said contact openings.

15. The method of claim 14 wherein said conductive layer is polycrystalline silicon.

16. The method of claim 14 wherein said first protective layer is silicon nitride.

17. The method of claim 14 wherein said second protective layer is a material whose oxide is impervious to silicon dioxide etchants.

* * * * *